US008076910B2

(12) United States Patent
Bickel

(10) Patent No.: US 8,076,910 B2
(45) Date of Patent: Dec. 13, 2011

(54) POWER FACTOR CORRECTION USING HIERARCHICAL CONTEXT OF A POWER MONITORING SYSTEM

(75) Inventor: Jon A. Bickel, Murfreesboro, TN (US)

(73) Assignee: Schneider Electric USA, Inc., Palatine, IL (US)

(*) Notice: Subject to any disclaimer, the term of this patent is extended or adjusted under 35 U.S.C. 154(b) by 793 days.

(21) Appl. No.: 12/228,209

(22) Filed: Aug. 11, 2008

(65) Prior Publication Data
US 2010/0037189 A1    Feb. 11, 2010

(51) Int. Cl.
*G05F 1/70* (2006.01)
(52) U.S. Cl. .................. 323/205; 323/209; 323/211
(58) Field of Classification Search .............. 323/205, 323/206, 207, 208, 209, 210; 363/16, 17, 363/20, 21.01, 21.12, 21.13, 95, 96, 97, 98
See application file for complete search history.

(56) References Cited

U.S. PATENT DOCUMENTS

| | | | | |
|---|---|---|---|---|
| 5,367,246 | A * | 11/1994 | Kaiser | 323/212 |
| 5,960,207 | A * | 9/1999 | Brown | 713/300 |
| 6,700,358 | B2 * | 3/2004 | McDaniel et al. | 323/211 |
| 7,002,321 | B2 * | 2/2006 | McDaniel et al. | 323/211 |
| 7,272,518 | B2 | 9/2007 | Bickel et al. | 702/61 |
| 2004/0225649 | A1 | 11/2004 | Yeo et al. | |
| 2006/0250117 | A1 | 11/2006 | Rayburn | |
| 2006/0259277 | A1 | 11/2006 | Fantana et al. | |
| 2007/0005277 | A1 | 1/2007 | Bickel et al. | |
| 2007/0179726 | A1 | 8/2007 | Bickel | |

FOREIGN PATENT DOCUMENTS

WO    WO 2009/061291 A1    5/2009

OTHER PUBLICATIONS

Written Opinion corresponding to International Patent Application No. PCT/US2009/053133, European Patent Office, dated Nov. 5, 2010, 7 pages.
International Search Report corresponding to International Patent Application No. PCT/US2009/053133, European Patent Office, dated Nov. 5, 2010, 4 pages.
Lizeng Wu et al.: "Application of Multi-agent and Data Mining Techniques in Condition Assessment of Transformers"; Power System Technology; Dated 2004; (5 pages).
Kojovic Ljubomir A et al.: "Improved relay coordination and relay response time by integrating the relay functions" Power Engineering Society Meeting; Dated 2000 (6 pages).

* cited by examiner

*Primary Examiner* — Adolf Berhane
*Assistant Examiner* — Nguyen Tran

(57) ABSTRACT

Automated power factor correction analysis methods based on an automatically determined hierarchy representing how IEDs and transformers are linked together in an electrical system for reducing a utility bill, releasing capacity to the electrical system, reducing losses, and/or improving voltages. The automatically determined hierarchy places the system elements in spatial context and is exploited by the power factor correction analysis methods to identify power factor correction opportunities. Recommendations are made as to sizing and location of capacitors within the hierarchy where power factor improvements can be achieved. Harmonic distortion levels can be checked first to determine whether safe levels exist for capacitor banks. Recommendations are also checked to avoid leading power factors anywhere in the system due to the addition of capacitor banks. Capacitor bank location is tailored to the end-user's goal for power factor correction. Cost savings and payback periods associated with any ameliorative power factor correction activities are also determined.

18 Claims, 9 Drawing Sheets

POWER FACTOR CORRECTION USING HIERARCHICAL CONTEXT OF A POWER MONITORING SYSTEM

FIELD OF THE INVENTION

Aspects disclosed herein relate generally to utility systems, and, in particular, to a method for automatically determining optimum capacitor placement based on a hierarchical layout of an electrical system to improve the system's power factor.

BACKGROUND

Much energy is uselessly wasted today because end-users do not have a straightforward scheme for identifying and resolving inefficiencies throughout a monitored electrical system. Power factor correction is a time-consuming, tedious task that is extremely complex and intimidating for the end-user. In a typical installation that includes hundreds of monitoring devices, transformers, and other equipment, attempting to determine where power factor correction opportunities exist is a severely daunting proposition. Most end-users simply do not even try to identify these opportunities or resort to guesswork or quasi-guesswork that either does not result in an optimal power factor correction or, worst still, results in a leading power factor, which accelerates energy consumption.

One type of apparatus that can adversely impact an electrical system's power factor is the electric motor. Many studies have shown that motors in industrial facilities consume by far the largest percentage of energy of any electrical device used in the U.S. electrical infrastructure. Tens of billions of kWh are consumed by motors each year accounting for over 25% of all electricity sales in the U.S. The most common type of motor in use today is the polyphase induction motor, over 90% of which are squirrel cage induction motors. Because of their prevalence throughout industrial and commercial sectors, polyphase induction motors offer a great potential savings opportunity in both energy and operational costs throughout the motor's useful life.

What is needed, therefore, are automatic power factor correction methods that provide recommendations on ameliorating power factor for reducing a utility bill, releasing capacity on the electrical system, reducing losses, and improving voltage based on knowledge of an automatically determined hierarchy of an electrical system. The present disclosure is directed to addressing these and other needs.

BRIEF SUMMARY

The methods and systems disclosed herein rely on automatically determined hierarchical data indicative of a hierarchy of an electrical monitoring system that represents how intelligent electronic devices (IEDs), transformers, and other devices are linked (directly, indirectly, or not at all) together within the electrical system. By exploiting knowledge of an automatically determined hierarchy, the methods disclosed herein can provide recommendations to correct power factor (sometimes abbreviated herein as P.F. or PF) of the electrical system that provides at least the following benefits to the end-user:

Utility bill reduction (depending on the utility rate structure)
Released capacity for the electrical system
Loss reduction
Voltage improvement According to an aspect disclosed herein, an automatic power factor correction analysis method, includes: automatically determining a hierarchy of an electrical system, the hierarchy indicating how a number of intelligent electronic devices (IEDs) are linked to one another in the electrical system, each of the IEDs monitoring electrical characteristics; automatically storing a data representation of the hierarchy; automatically identifying from the automatically determined hierarchy a main IED that is monitoring a main power supply in the hierarchy; receiving maximum power data from corresponding current and voltage signals monitored by the main IED and an associated power factor that is coincident with the maximum power data; determining a reactive power value coincident with the maximum power data by receiving the reactive power value from the main IED or by deriving the reactive power value from the maximum power data or from data representing the current and voltage signals and the power factor coincident with the maximum power data; and calculating, based on the coincident power factor, an amount of positive or negative reactive power to supply to improve the coincident power factor toward a unity value, and, responsive thereto, storing a recommendation indicating at least a location and a size of one or more capacitors to be added in the automatically determined hierarchy for producing at least the amount of the reactive power such that the reactive power value is offset by the amount of the reactive power.

The method can further include: receiving minimum power data from the corresponding current and voltage signals monitored by the main IED and an associated second power factor; determining a second reactive power value coincident with the minimum power data by receiving the second reactive power value from the main IED or by deriving the second reactive power value from the minimum power data or from data representing the current and voltage signals and the second power factor coincident with the minimum power data; and verifying whether producing the amount of the reactive power automatically determined based on the coincident power factor would result in a leading power factor based on the second reactive power value.

The method can further include, if the verifying would result in the leading power factor, reducing the size of the one or more capacitors such that the amount of reactive power produced by the one or more capacitors is reduced so as to cause a corresponding power factor to not be leading.

The method can further include, if the verifying would result in the leading power factor, determining a periodicity to cycle at least one of the one or more capacitors on and off so as to cause a corresponding power factor to not be leading.

The method can further include calculating a cost savings realized by the addition of the one or more capacitors. The method can further include calculating a payback period indicating how long it would take for a cost of adding the one or more capacitors to be offset by the cost savings realized by adding the one or more capacitors.

The method can further include receiving an indication of a desired power factor between the coincident power factor and the unity value, wherein the calculating the amount of reactive power is based on the desired power factor. The method can further include, prior to the storing the recommendation: automatically determining whether an elevated level of harmonic frequencies exist in current or voltage signals being monitored by the main IED in the hierarchy; and if the level of the harmonic frequencies exceeds a threshold, storing with the recommendation an indication that the harmonic frequencies are present. The automatically determining whether the elevated level of harmonic frequencies exist can be carried out by comparing a true power factor with a displacement power factor. The automatically determining whether the elevated level of harmonic frequencies exist can be carried out by measuring, at the main IED, reactive currents at non-fundamental frequencies, and determining whether the reactive currents exceed at least one criterion.

The method can further include: identifying a transformer in the hierarchy; identifying from the automatically determined hierarchy a first IED that is upstream of the transformer; determining a first power factor from power data monitored by the first IED; calculating, based on the first power factor, a corrected power factor that would release an amount of volt-amps capacity of the transformer to cause the transformer to be loaded at a reduced volt-amps capacity; and calculating, based on the amount of volt-amps capacity, a corresponding corrective reactive power value to be supplied by a capacitor bank, wherein the recommendation includes an indication of a size and a location of the capacitor bank, wherein the size is related to the corrective reactive power value and the location is downstream of the transformer in the automatically determined hierarchy.

The method can further include: receiving a selection of a first of the IEDs; receiving from the first IED power data measured by the first IED; calculating a loss reduction factor as a function of a power factor based on the power data and a desired power factor; calculating a loss reduction improvement value representing an improvement in loss reduction of the electrical system and storing the loss reduction improvement value; and calculating a size of a second set of one or more capacitors that will correct the power factor to the desired power factor, wherein the recommendation includes an indication of the size of the second set of the one or more capacitors.

According to another aspect disclosed herein, an automatic power factor correction analysis method, includes: automatically determining a hierarchy of an electrical system, the hierarchy indicating how a number of intelligent electronic devices (IEDs) are linked to one another in the electrical system, each of the IEDs monitoring electrical characteristics; automatically storing a data representation of the hierarchy; identifying a transformer in the hierarchy; identifying from the automatically determined hierarchy a first IED that is upstream of the transformer; determining a coincident power factor from power data monitored by the first IED; calculating, based on the coincident power factor, a corrected power factor that would release an amount of volt-amps capacity of the transformer to cause the transformer to be loaded at a reduced volt-amps capacity; calculating, based on the amount of volt-amps capacity, a corresponding corrective reactive power value to be supplied by a capacitor bank; and storing a recommendation indicating a size and a location of the capacitor bank, wherein the size is related to the corrective reactive power value and the location is downstream of the transformer in the automatically determined hierarchy.

The method can further include: automatically identifying at least one IED in the automatically determined hierarchy that is upstream of the first IED; receiving respective power data from the first IED and the at least one IED pseudo-synchronously; based on the corrective reactive power value, calculating an amount of released volt-amps capacity at the at least one IED; and storing the amount of released volt-amps capacity at the at least one IED.

According to another aspect disclosed herein, an automatic power factor correction analysis method, includes: automatically determining a hierarchy of an electrical system, the hierarchy indicating how a number of intelligent electronic devices (IEDs) are linked to one another in the electrical system, each of the IEDs monitoring electrical characteristics; automatically storing a data representation of the hierarchy; receiving a selection of a first of the IEDs; receiving from the first IED power data measured by the first IED; calculating a loss reduction factor as a function of a power factor based on the power data and a desired power factor; calculating a loss reduction improvement value representing an improvement in loss reduction of the electrical system and storing the loss reduction improvement value; calculating a size of one or more capacitors that will correct the power factor to the desired power factor; and storing a recommendation indicating the size of the one or more capacitors.

The method can further include calculating a cost savings realized by the addition of the one or more capacitors. The method can further include calculating a payback period indicating how long it would take for a cost of adding the one or more capacitors to be offset by the cost savings realized by adding the one or more capacitors. The method can further include calculating how much the voltage drop between the first IED and another of the IEDs would improve by the addition of the one or more capacitors, wherein the recommendation includes an indication of the voltage drop improvement.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
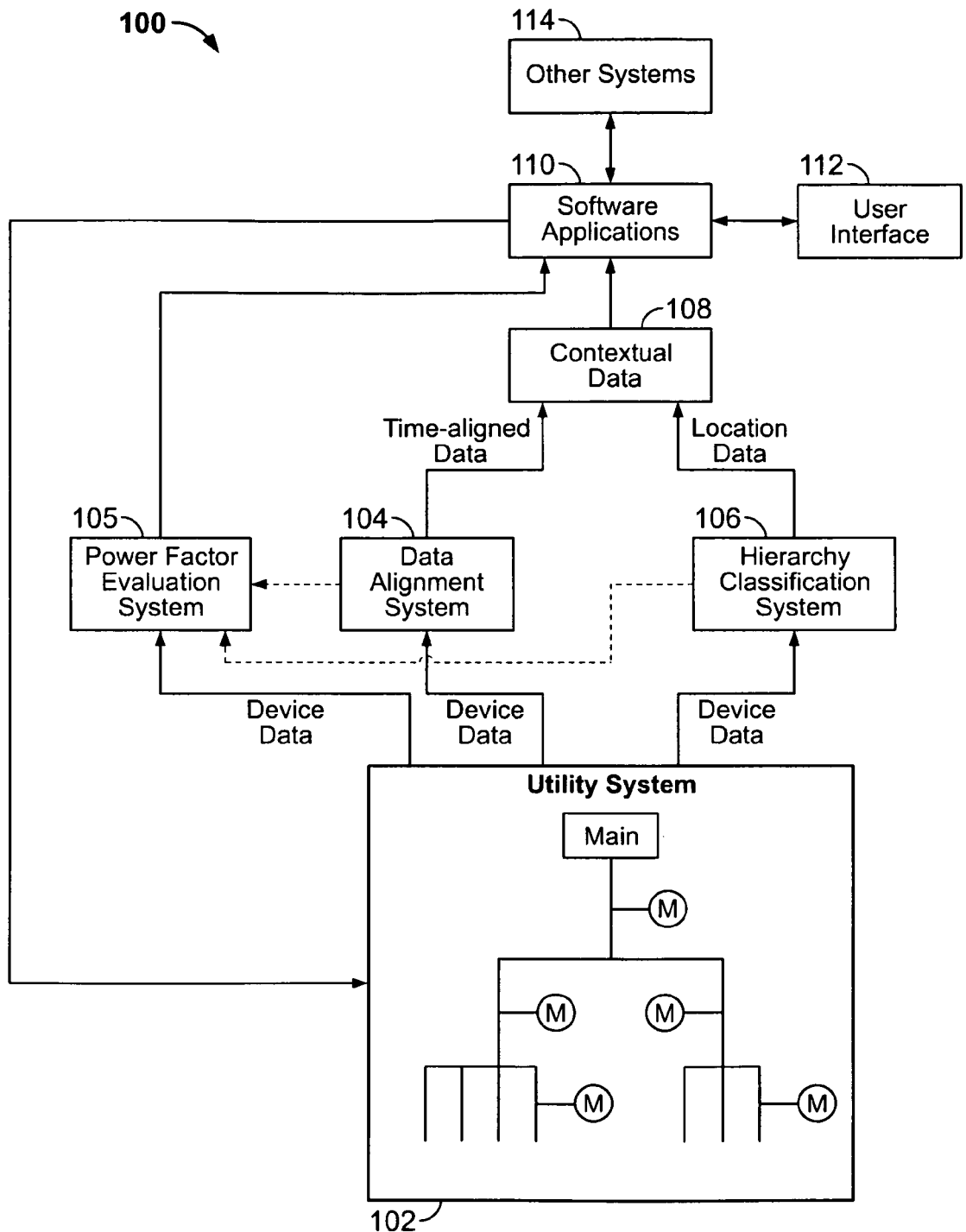
FIG. 1 is a functional block diagram of an automated data integrated monitoring system that includes a power factor evaluation system.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Turning now to FIG. 1, an automated data integrated monitoring system 100 is generally shown. An electrical system 102 having multiple intelligent electronic devices (hereafter "IEDs") designated by the letter M provides data from each IED M that is communicated to an automated data alignment system 104 and an automated hierarchy classification system 106. As used herein, an IED refers to any system element or apparatus with the ability to sample, collect, or measure one or more operational characteristics or parameters of an electrical system 102. The data is aligned automatically in temporal or pseudo-temporal context in the automated data alignment system 104 and produces data that is temporally or synchronously aligned such that it represents the data when it was actually seen simultaneously by the monitoring devices M in the electrical system 102. The hierarchy classification system 106 automatically learns the hierarchy of monitoring devices present in the electrical system 102 and their positional relationships relative to one another. Examples of the hierarchy classification system 106 and the auto-learned hierarchy algorithms 400, 500, 550 associated therewith are described in commonly assigned U.S. Pat. No. 7,272,518, titled "Automated Hierarchy Classification in Utility Monitoring Systems," issued Sep. 18, 2007, and in commonly assigned PCT Patent Application No. PCT/US2006/034394, titled "Improvements in Hierarchy Determination for Power Monitoring Systems," filed Nov. 5, 2007 [SPL-0099]. A hierarchy as used herein includes a series of ordered groupings of things within a system. These relationships may be physical (based on a power system one-line diagram for example) or functional (based on cost centers or other organizational divisions). In an electrical power system context, a hierarchy describes the organization of the electrical power system (whether utility-side or demand-side of the point-of-common coupling (PCC)). As used herein, an "auto-learned hierarchy algorithm" refers to any of the auto-learned hierarchy algorithms disclosed in U.S. Pat. No. 7,272,518.

Each IED measures characteristics of the electrical system 102, and quantifies these characteristics into data that can be analyzed by a computer. For example, the monitoring device may measure power, energy, voltage, current, or other characteristics of electricity. In the electrical context, the IED may be based on a PowerLogic® Series 3000/4000 Circuit Monitor or a PowerLogic® ION7550/7650 Power and Energy Meter available from Schneider Electric or any other suitable IED device such as a microprocessor-based circuit breaker, relay, metering device, or power meter.

Generally, the hierarchy classification system 106 utilizes an auto-learned hierarchy algorithm in the monitoring system software (running on the computer 132) that is based on rules and statistical methods. Periodically, the monitoring system software polls each monitoring device in the electrical system 102 to determine certain characteristics or parameters of the electrical system 102 at that node (represented by M). Multiple samples of specified parameters are taken from each IED in the system at the same given point in time (synchronous) or at substantially the same point in time (pseudo-synchronous). Once the parameter data is collected from each node M in the electrical system 102, the auto-learned hierarchy algorithm analyzes the data and traces the relationships or links among the monitoring devices with respect to the time the data sample was taken and the associated value of the data sample. This analysis may be performed periodically to increase the probability that the hierarchy is accurate, or to ascertain any changes in the hierarchy. Once this iterative process reaches some predetermined level of statistical confidence that the determined layout of the electrical system 102 is correct, the auto-learned hierarchy algorithm ends. The final layout of the electrical system 102 is presented to the user for concurrence. As each IED's data is evaluated over time (the learning period) with respect to all other IEDs using the auto-learned hierarchy algorithm, a basic layout of the hierarchical structure of the electrical system 102 is determined based on the monitoring points (M) available. In this respect, the auto-learned hierarchy algorithm uses historical trends of the data from each IED, and those trends are compared to determine whether any interrelationship (link) exists between the IEDs. A more detailed hierarchical structure can be determined with more monitoring points available for analysis.

Samples of specific electrical characteristics (such as power, voltage, current, or the like) are simultaneously taken from each IED in the electrical system 102. This data is stored and analyzed with respect to the time the sample is taken, the associated value of the data point, and the IED providing the data. Data taken from each IED in the electrical system 102 is compared with each other to determine whether any correlation exists between the IEDs. The data is analyzed for statistical trends and correlations as well as similarities and differences over a predetermined period of time.

The data alignment system 104 aligns data, such as power, voltage, current, time, events, and the like, from the multiple IEDs in the electrical system 102. When data from all the IEDs is aligned to the same point (or approximately the same point based on pseudo-temporal alignment) in time that the data occurred, the data can be put into a temporal (synchronous) or pseudo-temporal (pseudo-synchronous) context from which additional decisions regarding hardware and software configuration can be automatically made or recommended. The measured data from various IEDs may be synchronized or pseudo-synchronized with each other within a temporal or pseudo-temporal context. Temporal alignment is more precise than pseudo-temporal alignment. As used herein, temporal is synonymous with synchronous. Pseudo-temporal alignment takes data within an acceptable range based on load changes in the system. Pseudo-temporal alignment systems typically utilize a global positioning system (GPS) or network time protocol (NTP) for clock synchronization. Automatic temporal alignment implementations are described in commonly assigned U.S. patent application Ser. No. 11/174,099, filed Jul. 1, 2005, entitled "Automated Precision Alignment of Data in a Utility Monitoring System." In an automatic temporal alignment implementation, the data alignment system 104 synchronously aligns all IEDs (represented by M) in an electrical system hierarchy to the zero-crossing of all three phase voltages without the use of additional hardware, notwithstanding potential phase shifts between various IEDs, such as for example, those caused by certain transformer configurations. When the data of the monitoring devices is aligned synchronously with each other, the system data is essentially aligned with respect to the time it occurred, making more complex data analyses feasible.

Figure 2:
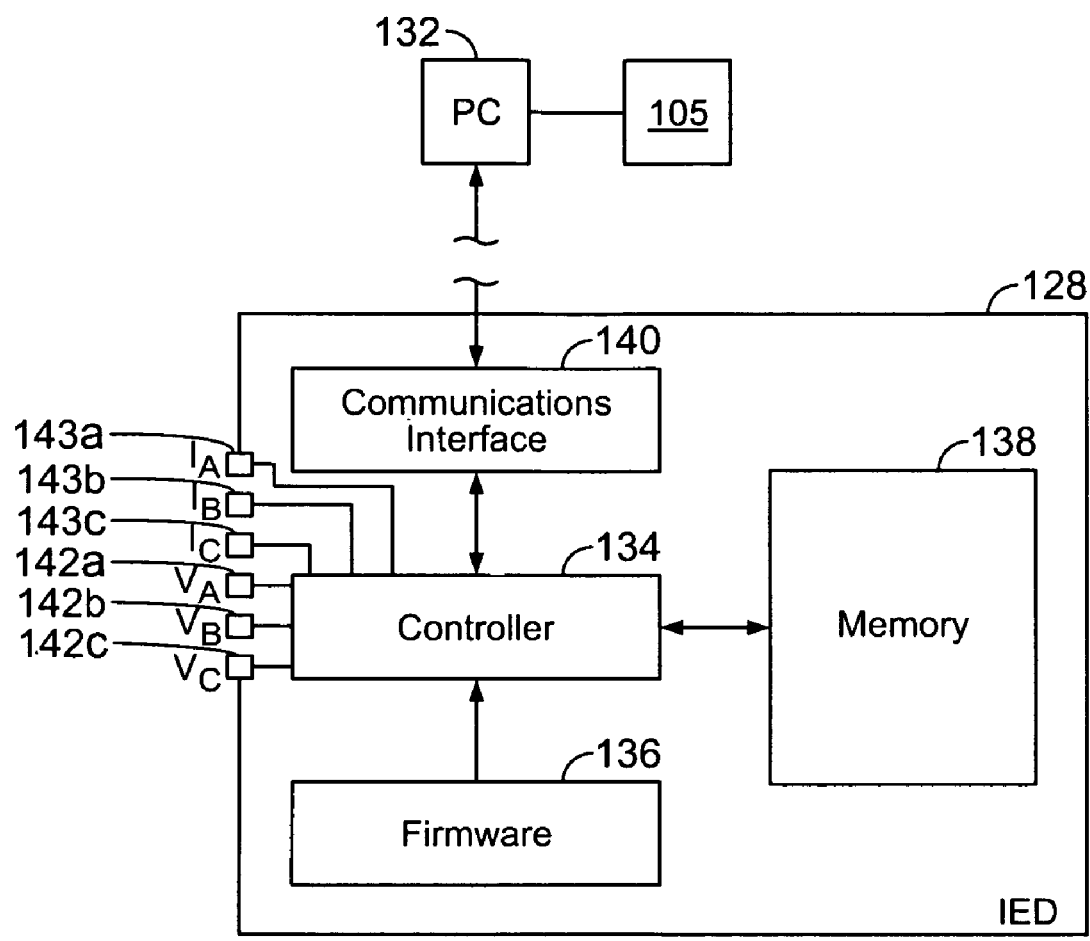
FIG. 2 is a functional block diagram of an intelligent electronic device coupled to the power factor evaluation system shown in FIG. 1.

An exemplary IED 128 is shown as a functional block diagram in FIG. 2. The IED 128 includes a controller 134, firmware 136, memory 138, a communications interface 140, and three phase voltage conductor connectors 142a,b,c, which connect to the $V_A$, $V_B$, and $V_C$ phase voltage conductors, respectively, and are coupled to the controller 134. Three phase current conductor connectors 143a,b,c, which connect to the $I_A$, $I_B$, and $I_C$ phase current conductors, respectively, are optionally coupled to the controller 134. The firmware 136 includes machine instructions for directing the controller to carry out operations required for the IED 128. Memory 138 is used by the controller 134 to store electrical parameter data (power, energy, current, voltage, etc.) measured by the IED 128.

Instructions from a computer 132 are received by the IED 128 via the communications interface 140. Those instructions include, according to an aspect herein, instructions that direct the controller 134 to mark the cycle count, to begin storing electrical parameter data, or to transmit to the computer 132 electrical parameter data stored in the memory 138. The electrical parameter data can include any data acquired by IEDs, including any combination of power, energy, current, voltage, frequency variations, amplitude variations, and phase variations.

The data integrated monitoring system 100 also includes a power factor evaluation system 105 according to aspects of the present invention, which may receive electrical parameter data associated with the electrical system 102 via manual or automated methods or time-aligned data that has been automatically generated by the automated data alignment system 104. The power factor evaluation system 105 includes the algorithms 600, 606, 608, 610 described in more detail below.

With limited natural resources and the ever-increasing global demand for energy, energy costs will continue to increase into the future (barring some revolutionary technological development in the energy sector). And as energy costs rise around the world, the incentive for facilities to operate their equipment more efficiently will compound over time. Authorities use mandatory ways (e.g., regulations) to enforce conservation and compensatory ways (e.g., special rate tariffs) that reward users for using less energy. In either case, decreasing energy consumption will decrease the bottom line costs to the user.

In alternating current (ac) electrical systems, the current may not be (and, in fact, typically is not) in phase with its corresponding voltage. Three examples will illustrate the effects of load types on an ac electrical system's power factor: 1) an ideal resistance, 2) an ideal inductive reactance, and 3) an ideal capacitive reactance.

In the first example, the result of applying an ac voltage to an ideal resistance impedance is that the voltage and current are exactly in phase with each other. In other words, the ac voltage and current are perfectly aligned with each other at the points where their respective values from maximum to minimum correspond perfectly with each other and where their zero-crossings occur. This is known as a unity power factor and results in maximum power transfer from the source to the load. In the second example, applying an ac voltage to an ideal inductive reactance will result in a lag of 90° by the current. In the third example, applying an ac voltage to an ideal capacitive reactance will result in the current leading the voltage by 90°. In reality, all loads appear as some combination of the three examples mentioned above.

Some of the examples assume the presence of induction motors, which present opportunities for power factor correction. Polyphase induction motors are powered by current composed of both resistive and inductive components. The resistive component includes the load current and the loss current; and the inductive component includes the magnetizing current and the leakage reactance. It is possible to cancel out the inductive current component supplied to the motor by supplying a "counter current" produced by a capacitive load. The addition of a capacitor does not affect the magnetizing current or the leakage reactance of the motor, but it does offset the inductive component at the point where the capacitor is installed. As more capacitance is added, the power factor angle, $\theta$, becomes smaller until a unity power factor is achieved ($\theta=0$). At unity power factor, the electrical system is at its optimum performance for maximum power transfer. Note that placing excessive capacitance on the circuit will result in a leading power factor ($\theta$ is negative in this case), which is not desirable.

The following example illustrates how to correct a power factor associated with an induction motor by adding a capacitive load near the motor. Assume a three-phase induction motor uses 200 Amps of current at a power factor of 0.78 ($\theta_{old}=38.73°$). The real and reactive currents are calculated as follows:

Real(resistive)Current=200×cos($\theta_{old}$)=200× 0.78=156<0° Amps

Reactive(inductive)Current=200×sin($\theta_{old}$)=200× 0.63=125.15<90° Amps

To ensure these values are correct, the vector sum of the real and reactive components should produce the original current and $\theta_{old}$ values:

Total Current=156<0°+125.15<90°=200<38.73° Amps

The reactive (inductive) component can be reduced by adding a capacitive load (generally a capacitor bank) near the motor. The capacitive load is also expressed as reactive in nature, but it uses the current 180° out of phase at the same frequency from the inductive load; thus, a canceling effect occurs. To bring the power factor from 0.78 ($\theta_{old}=38.73°$) to 0.95 ($\theta_{new}=18.19°$), a capacitor bank would have to be sized such that its corresponding current would be:

New Reactive Current=156<0°×tan(18.19) =51.26<90° Amps

Reactive Current from Capacitance=125.15<90°− 51.26<90°=73.89<90° Amps

New Total Current$_{new}$=156<0°+ 51.26<90°=164.21<18.19° Amps

A reduction in current (and energy) of approximately 18% is obtained by the addition of capacitance to the system based solely on the power factor improvement. While inductive loads such as induction motors require (consume) reactive current from electrical systems, capacitors provide (supply) reactive current to electrical systems. Each kVARh of reactive energy passing through an electrical system produces superfluous line losses and potentially higher energy bills, so the goal of using capacitors is to balance the VAR requirements of an electrical system. Permanently installed monitoring devices can quantify the VAR flows and offer additional savings opportunities within a facility's electrical system. It should be noted that some industrial systems may use motors with adjacent loads that are complex (e.g, non-linear loads such as adjustable speed drives). These complex load-types may react negatively to the addition of standard power factor correction capacitors due to the potential of the electrical system becoming "tuned" at some corresponding resonant frequency. This disclosure can identify electrical systems with complex load-types to reduce the probability of misapplying power factor correction capacitors.

As stated above, the addition of capacitance to an electrical system may result in both beneficial and detrimental consequences. Based on contextual spatial and/or temporal data from the power monitoring system, the inventions disclosed herein provide the end-user with automated analyses and proposed solutions for improving a facility's power factor depending on the end-user's primary goal: utility bill reduction, released capacity, loss reduction, or voltage improvement. The installation of capacitors simultaneously impacts all of these goals to some degree with the primary difference being the proposed location of capacitors within the hierarchy, the size of the capacitance required, and the desired goal.

Having knowledge of an electrical monitoring system's hierarchy allows the IEDs to be put into spatial context relative to one other. Knowledge of spatial context between each IED and every other IED is important to the automatic power factor correction methods disclosed herein. Without knowledge of the IEDs' hierarchy within the electrical system, the IEDs appear in a typical power monitoring system as a random collection of devices. The inventions disclosed herein exploits previously disclosed technology to place the IEDs into spatial context within a hierarchy. A key to determining how the addition of capacitance will influence the entire electrical system depends upon how the electrical system is arranged. The combination of hierarchical knowledge with synchronously or pseudo-synchronously measured electrical data from affected IEDs is also important to some aspects of the automatic power factor correction methods disclosed herein.

While the need for capacitance to improve the power factor in an inductive electrical system may be evident, determining the optimum location and size of capacitors (and their associated effects) for a given purpose or goal is a daunting challenge for the typical end-user. In the interests of simplicity, the topics of optimum location and optimum size will be discussed one at a time.

Determining Optimum Location and Size of Capacitor Bank

Determining the optimum location of a capacitor bank depends upon what the end-user is trying to accomplish with the capacitor bank. Electrical systems are inherently inductive due to the inductive nature of conductors and most loads. Inductive loads such as motors require VARs (reactive power) to operate, and the application of capacitance on an electrical system does not eliminate that VAR requirement. Instead, capacitance reduces the reactive current flow to an inductive load by supplying reactive current itself.

Figure 3:
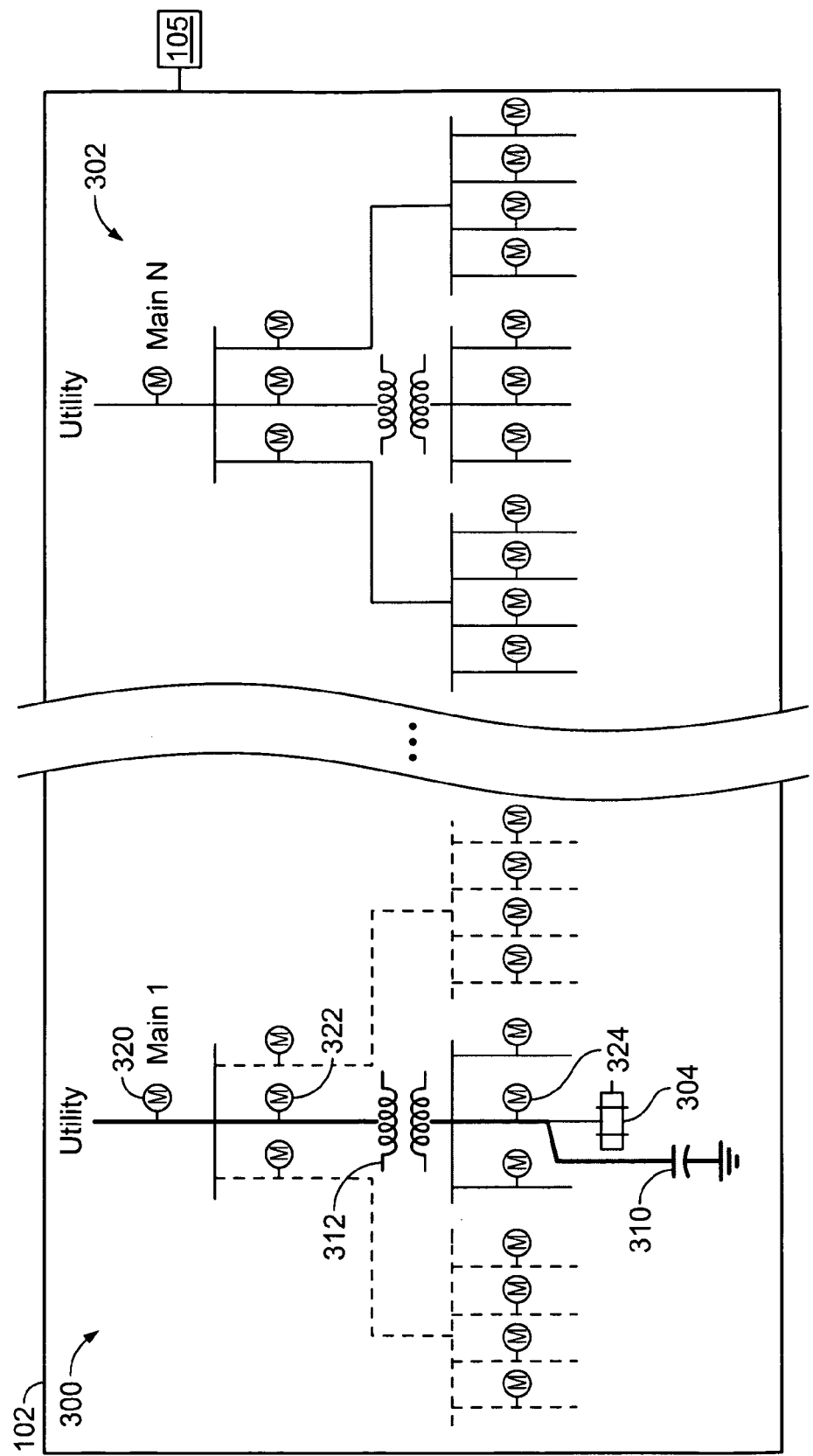
FIG. 3 is an example of an automatically determined one-line diagram depicting the hierarchy of a power monitoring system having multiple utility service entrances with a capacitor installed adjacent to a motor load.

FIG. 3 is an exemplary model of a simple electrical system 102 with a motor load 304 operating. The motor 304 requires some amount of reactive energy to supply its magnetic field as it builds and collapses. Normally, this reactive energy would be supplied by reactive currents flowing in from the utility and through the facility's electrical system 300 to the motor 304. In this example, a capacitor bank 310 has been installed at the motor 304 to supply the motor's reactive currents needs. The portions of the electrical system 300 in FIG. 3 that are highlighted in heavy lines illustrate the path that experiences reduced current flow due to the addition of the capacitor bank 310. It should be noticed that the path from the motor 304 to the point where the capacitor bank 310 is connected still has the same current flow; nothing has changed. Again, the motor's requirement for VARs (reactive power) has not changed.

Figure 4:
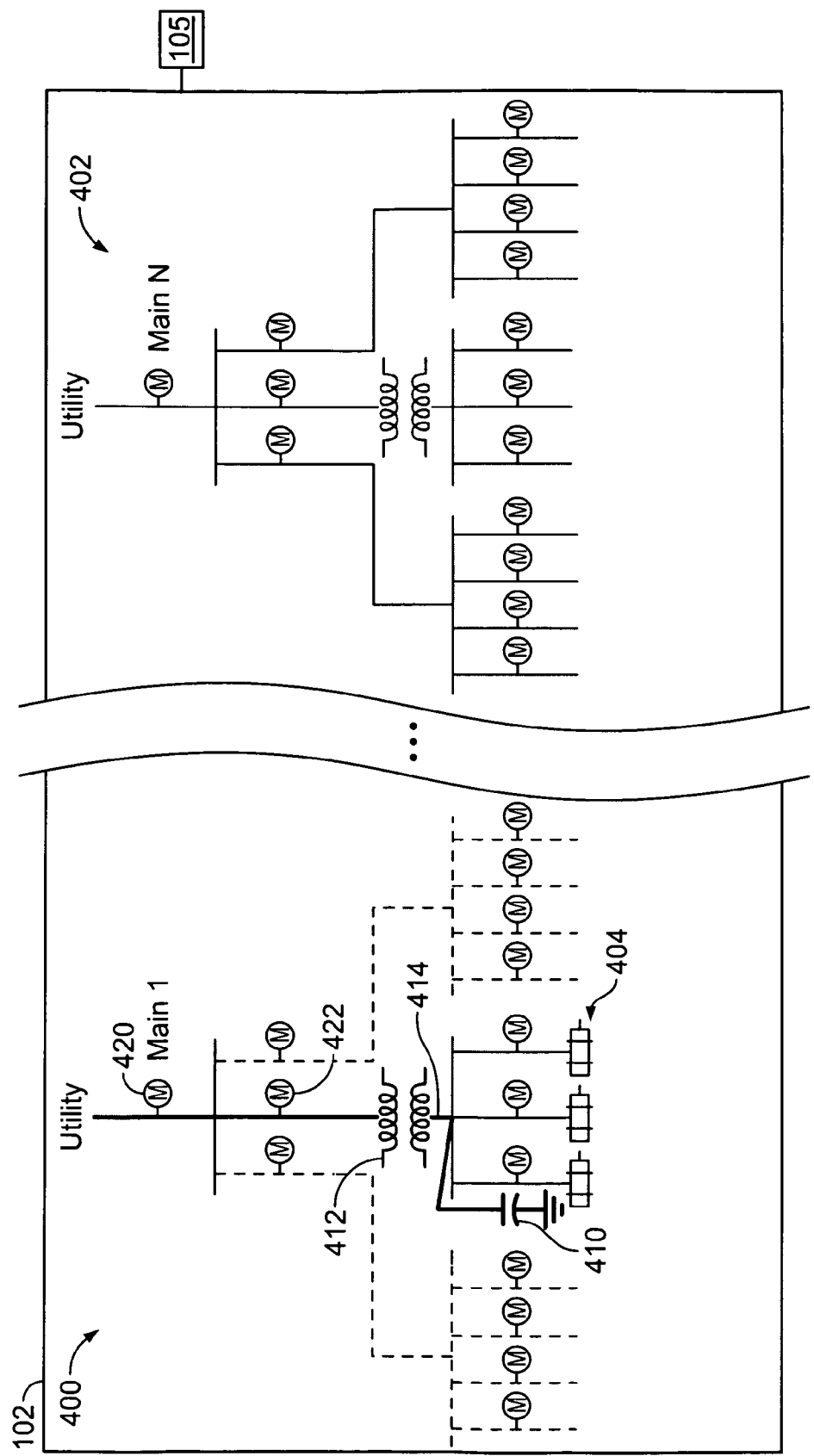
FIG. 4 is an example of an automatically determined one-line diagram depicting the hierarchy of a power monitoring system having multiple utility service entrances with a capacitor installed just downstream of a transformer.

FIG. 4 is an exemplary model of the same electrical system 102 with the capacitor 410 moved to the bus 414 serving the original motor and other motor loads 404. Assuming the capacitor 410 is sized to offset the VAR requirements for all inductive loads served by the bus 414, the portions of the electrical circuit highlighted in heavy lines illustrate the portions of the path that experience reduced current flow due to the addition of the capacitor bank 410. Again, the paths from the capacitor bank 410 to the loads 404 do not experience any relief in current flow because capacitors 410 only reduce the current flow from their point of installation towards the source.

Figure 5:
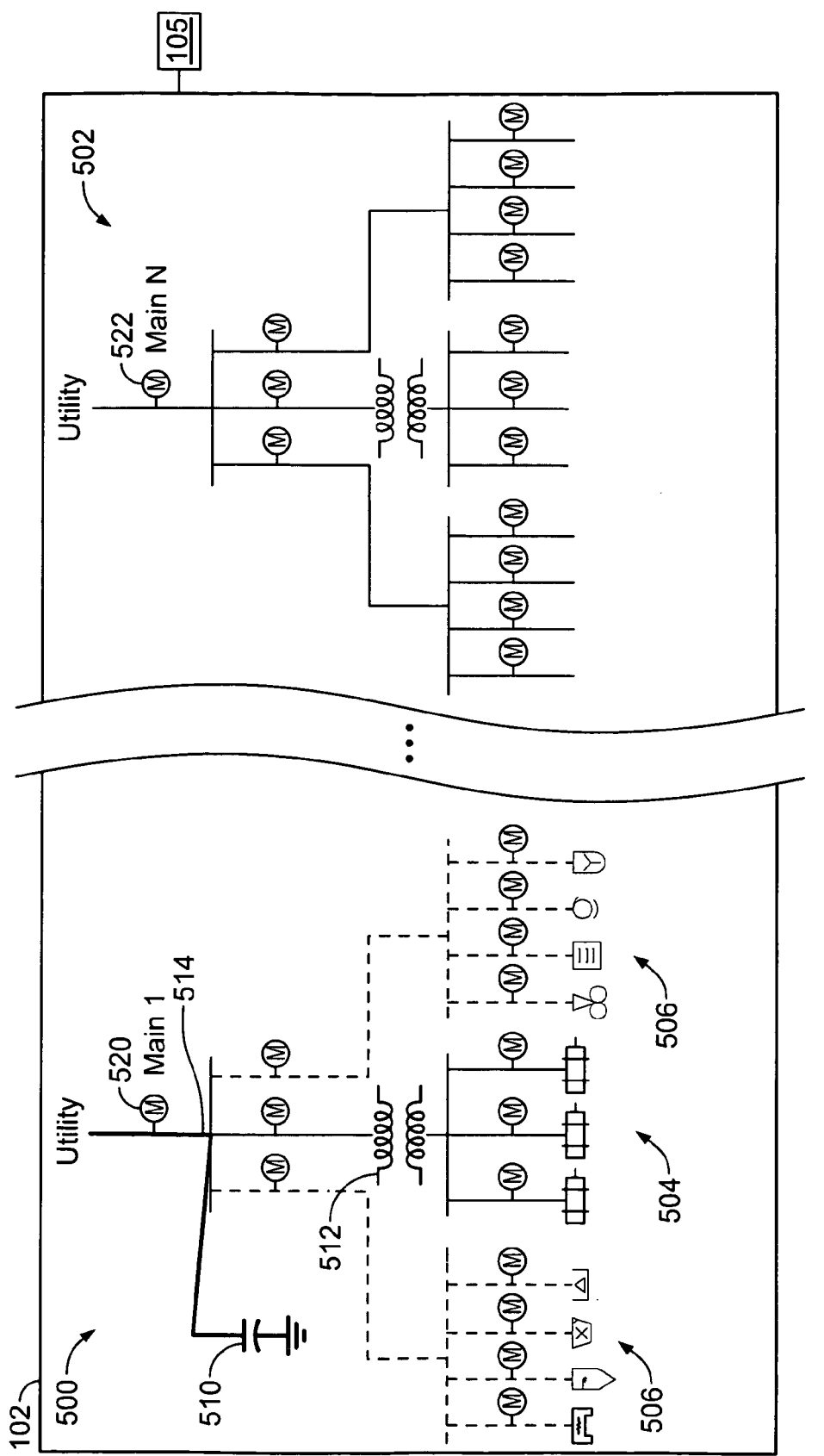
FIG. 5 is an example of an automatically determined one-line diagram depicting the hierarchy of a power monitoring system having multiple utility service entrances with a capacitor installed on the first bus downstream of a main IED.

Finally, FIG. 5 is an exemplary model of the same electrical system 102 with the capacitor bank 510 moved to the main bus 514 serving all loads in the electrical system 500. Assuming the capacitor 510 is sized to offset the VAR requirements for all inductive loads 504, 506 served by the main bus 514, the portions of the electrical circuit 500 highlighted in heavy lines illustrate the portions of the path that experience reduced current flow due to the addition of the capacitor bank 510. Only the utility experiences reduced current flow; none of the electrical infrastructure below the capacitor bank experiences any current flow relief.

As an example, assume the motor 304 in FIG. 3 is operating at 500 kW with a power factor of 0.75. This would result in the total power to the motor 304 being approximately 667 kVA, where kVA=kW/P.F. The total reactive power to the motor 304 would be approximately 441 kVARs, where kVARs= $\sqrt{667^2-500^2}$. So, applying 441 kVARs of capacitance at the motor 304 would reduce the total power by 167 kVA and increase the power factor to unity. The same 441 kVAR capacitor bank 310 applied to the motor 304 would also release 167 kVA of capacity on the highlighted infrastructure (conductors, transformers, etc.) and reduce the facility's apparent power by the same.

In another example using. FIG. 5, assume the total real power measured by the main IED 520 located at the main is 2000 kW with a power factor of 0.85. This would indicate (using the formulas from the previous example) a total apparent power and reactive power of approximately 2353 kVA and 1240 kVAR, respectively. In this example, the addition of a 1240 kVAR capacitor bank 510 as shown would reduce the electrical system's demand from the utility by approximately 353 kVA; however, the capacity and losses within the electrical system 500 would remain the same as they were without the addition of the capacitor bank.

FIGS. 3-5 illustrate how the location of a capacitor bank 310, 410 510 affects the flow of reactive currents. Reducing current flow along a path will simultaneously provide additional capacity along that same path. For example, FIGS. 3 and 4 demonstrate how the addition of a capacitor bank 310, 410 reduces the reactive current flow through the transformer 312, 412 shown in these electrical systems 300, 400 (it also reduces the current flow through the utility transformer which is not shown). The capacitor bank 510 in FIG. 5 only reduces reactive current flow for the utility, and does not provide any relief for the facility's electrical system 500.

The size and location of capacitor bank(s) 310, 410, 510 will depend upon the ultimate goal of the end-user. If the end-user is merely trying to reduce their energy bill, then it would be logical to place a single larger capacitor bank at the main service entrance(s) from the utility, such as shown in FIG. 5. Using a single larger capacitor bank is more cost effective, easier to install and maintain, and easier to control. If the end-user is trying to release capacity, reduce losses, and/or improve voltage levels in some portion of their electrical system, then targeting equipment downstream from the area of interest with smaller capacitor banks would be a more logical approach, such as shown in FIG. 3 or 4. In short, the size and location of capacitor banks are interrelated with each other and wholly depend upon the purpose or goal that is to be accomplished.

It is important to note that leading power factors (current leads the voltage) are even less desirable than lagging power factors (voltage leads the current), and therefore, oversizing a capacitor bank is not beneficial. As is inferred from FIGS. 3-5 above, knowledge of both the monitoring system's hierarchy and electrical characteristics must first be acquired to determine where to place the additional capacitor(s), what size of capacitor bank(s) to use, and how additional capacitance will affect an electrical system. Comprehensive analysis of an electrical system is all but impossible or extremely laborious and time consuming without this knowledge. To better make this point, suppose the end-user does not have knowledge of the spatial relationships among the IEDs and transformers in an electrical system, and desires to add capacitance to each point where the IED was measuring a lagging power factor. There is a very high likelihood that the end-user would inadvertently add redundant capacitance to one or more circuits because adding capacitance to a downstream IED would affect the reactive current flow through upstream IEDs as demonstrated in FIGS. 3-5. Ultimately, the redundant capacitance added to locations where the IEDs are related (directly or indirectly) can undesirably result in a leading power factor for the electrical system. Knowledge of the IEDs' hierarchical order minimizes the possibility of this occurring.

To simplify analyzing the monitoring system for end-users, the power factor evaluation algorithm 600 uses the auto-learned hierarchy algorithm described in commonly assigned U.S. Pat. No. 7,272,518, titled "Automated Hierarchy Classification in Utility Monitoring Systems," issued Sep. 18, 2007, in commonly assigned PCT Patent Application No. PCT/US2006/034394, titled "Improvements in Hierarchy Determination for Power Monitoring Systems," filed Nov. 5, 2007 [SPL-0099], and in commonly assigned U.S. patent application Ser. No. 12/151,309, titled "Automated Hierarchical Classification for Utility Systems With Multiple Sources," filed May 6, 2008 [SPL-0106] to automatically determine the hierarchical order for all IEDs and transformers in the electrical system 102 (602) shown in FIG. 6. A representation of the hierarchy is stored by the power factor evaluation system 105 in a computer-readable memory. There may be just one point-of-common coupling (PCC) with the utility (see FIG. 1) or many (see FIGS. 3-5). Once the hierarchical order is determined for all systems, pseudo-synchronously or synchronously captured historical electrical data (power, voltage, current, harmonic, etc.) is analyzed to determine whether standard capacitor banks would be advisable based on the magnitude and location of harmonic distortion in the electrical system. There are several methods of determining whether the application of standard capacitor banks is advisable in the first instance.

One method of determining whether standard capacitor banks are advisable is to analyze the magnitudes and specific harmonic frequencies of voltages and/or currents present in each sub-system hierarchy (300, 302). Elevated harmonic distortion levels would indicate the need for caution when installing power factor correction equipment because harmonic frequencies may adversely affect equipment including the capacitor banks themselves.

Another derivative of the method described above is to compare the true power factor with the displacement power factor to determine whether the two are close in value to each other. The true power factor measures rms values to calculate its result while the displacement power factor measures fundamental values (e.g., 60 Hz) to calculate its results. If the true power factor and the displacement power factor are close to equal, then there should be few harmonics on the electrical system. If the true power factor is less than the displacement power factor (it can never be more), then non-fundamental frequencies exist on the electrical system and additional precautions will be recommended when installing standard capacitor banks. It is possible for one sub-system (300) to be experiencing higher levels of harmonic voltages/currents than other sub-systems (302), so recommendations would be made accordingly.

Another method takes direct measurements of the reactive currents at non-fundamental frequencies by the IEDs. When the magnitude of these reactive currents exceed at least one criterion (e.g., exceed a predetermined acceptable reactive current level or percentage), a recommendation is made that caution should be exercised prior to installing any capacitor banks. Or, the recommendation may be not to install any capacitor banks until further analysis of the effects of the non-fundamental frequencies could be carried out.

Figure 6:
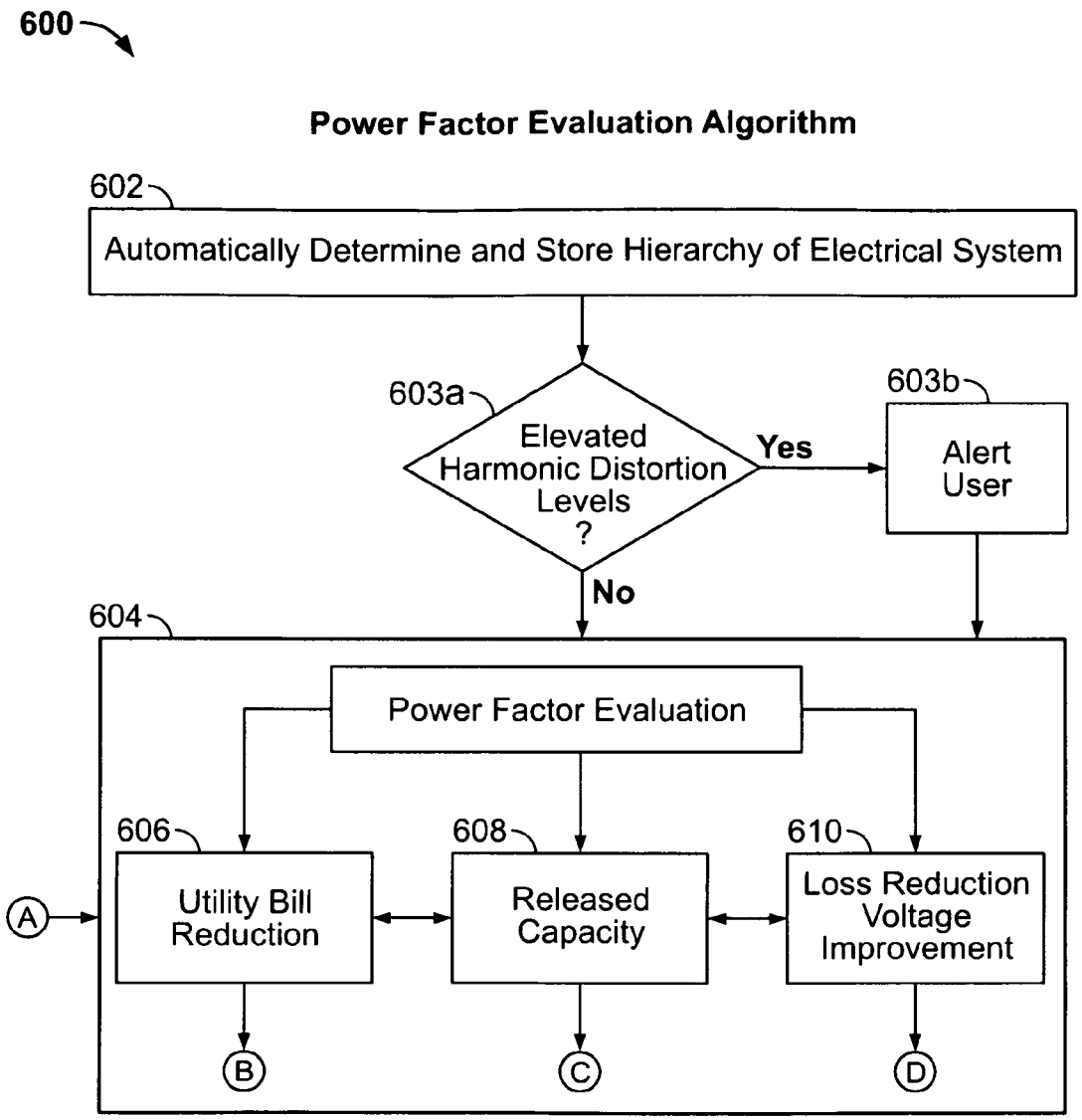
FIG. 6 is a functional block diagram of a power factor evaluation algorithm that is executed in the power factor evaluation system shown in FIG. 1.

Once the suitability of installing capacitor banks is determined, an analysis of the electrical data from at least some of the capable IEDs (capable in the sense that the IED has the ability to communicate its monitored data to a remote computing device and to measure the appropriate electrical characteristics required for analysis) is performed (604) as shown in FIG. 6. This analysis evaluates the reactive power flows throughout the capable IEDs with respect to their hierarchical position to determine any evident opportunities for savings or improvements. Because the number of different size and placement configurations for capacitor banks are nearly innumerable for even a small electrical system, the power factor evaluation system 105 allows the end-user to define their primary goal for the capacitor banks: utility bill reduction (606), released system capacity (608), loss reduction (610), and/or voltage improvement (610). The end-user may specify one or more desired goals, which causes the associated algorithm 606, 608, 610 to be carried out, or the power factor evaluation system 105 can periodically carry out any or all of the algorithms 606, 608, 610.

The power factor evaluation algorithm 600 determines whether elevated harmonic distortion levels exist in the electrical system (603a). If so, the end-user is alerted (603b) to exercise caution when installing any new capacitor banks or to avoid installing any capacitor banks until a more detailed harmonics distortion evaluation can be made. At the end-user's option, the end-user may terminate the power factor evaluation or may continue to obtain recommendations from the power factor evaluation system 105, now armed with the knowledge that elevated levels of harmonic frequencies exist in the electrical system. Although the harmonic distortion level evaluation blocks 603a, 603b are shown in FIG. 6 as being carried out after the hierarchy of the electrical system, is automatically determined and stored, it is contemplated that the harmonic distortion level evaluation can be carried out anywhere in the power factor evaluation system 105, such as in the algorithms 606, 608, 610.

Utility Bill Reduction

Many utility tariffs provide some form of incentive for consumers to achieve a minimum level of power factor. This incentive is typically in form of a penalty if certain power factor levels are not maintained. The application of capacitance to an electrical system with a lagging power factor will reduce the kVAh and kVA demand by reducing the kVARs supplied by the utility (as illustrated in the examples above). Installing power-factor correction capacitors at the main service entrance(s) provides no benefit to the consumer other than reducing the aforementioned penalties and associated costs. It does benefit the utility because the utility entity is no longer are required to deliver VARs to the facility, and can use the freed excess capacity for other more profitable objectives.

If the end-user's goal is solely to reduce their utility bill (606), it is easier and more cost effective to install capacitors 510 on the first bus 514 downstream from their utility service entrance. However, some end-users (such as those managing large electrical systems including campuses, etc.) may have hundreds of mains and thousands of IEDs to track, and any form of manual analysis would be very difficult. Furthermore, the need to improve the power factor may exist at some of their buildings (or sub-systems), but not on others.

The power factor evaluation system 105 identifies the capable IEDs (e.g., 520) monitoring at the top of each sub-system (e.g., 500, 502) and evaluates their historical electrical data to determine their minimum and maximum power data and respective coincident power factors (i.e., the power factor at the time of a peak demand). The end-user may input the desired power factor or the system 105 assumes a default value (e.g., 95%). The system 105 must balance the competing considerations of adding enough capacitance to improve the power factor without adding too much such that the power factor goes from lagging to leading. Sizing the capacitor banks for the highest measured or expected load condition provides the biggest savings for the end-user.

For example, if the maximum power data at a main IED 520 is 520 kVA, 400 kW, and 332 kVAR, the coincident power factor is 77%. Improving the power factor to 95% would result in a new apparent power of 420 kVA (given by 400 kW/0.95). The new reactive power would be 128 kVARs (given by $[(420 \text{ kVA})^2-(400 \text{ kW})^2]^{1/2}$]), and the required capacitor bank would be 204 kVAR (given by 332 kVARs–128 kVARs). The power factor evaluation system 105 can access a lookup table to determine a typical cost for installed capacitance/kVAR and provide a rough cost to install the capacitor bank 510. Assuming the installed cost for the capacitors 510 would be $25/kVAR, the total installed cost would be $5,100 (given by $25/kVAR×204 kVAR). The power factor evaluation system 105 allows the end-user to enter their demand charge/kVA, so if the demand charge was $8/kVA, the total savings would be $800/month (given by $8/kVA×[520 kVA–420 kVA]). The total payback period for the capacitor bank would be 6.375 months (given by $5,100/$800/month). Note that this calculation does not include relief from power factor-related penalties associated with the utility's tariffs.

To be thorough, the power factor evaluation system 105 would also review the minimum power data and the coincident power factor. If the minimum power data at the main IED is 300 kVA, 150 kW, and 260 kVAR, the coincident power factor is 50%. The additional 204 kVAR capacitor bank 510 added would reduce the reactive power to 58 kVARs (given by 260 kVAR–204 kVARs). The new total apparent power would be approximately 161 kVA (given by $[(150 \text{ kW})^2+(58 \text{ kVAR})^2]^{1/2}$). The power factor evaluation system 105 concludes that the power factor will not be leading even during unloaded conditions.

Using the same example where the minimum power data at the main IED 520 is 200 kVA, 100 kW, and 173 kVAR, the coincident power factor is again 50%. The additional 204 kVAR capacitor bank 510 added would result in a leading power factor of 31 kVAR at its point of connection 514 to the electrical system 500 (given by 173 kVAR–204 kVAR). One of two solutions or both would be recommended to the end-user to avoid a leading power factor: 1) reduce the size of the capacitor bank 510 to 173 kVAR, or 2) provide a control scheme to switch some percentage of the capacitor bank 'on' and 'off' the electrical system 500.

The above calculations are performed on the power data accumulated from all capable IEDs monitoring (e.g., 520, 522) each service entrance. The results from these calculations are aggregated to provide the total costs and the total payback period for each or all capacitor banks 510. Capacitor bank sizes, their respective locations, and any associated control mechanisms can be displayed to the end-user. All of this information is provided to the end-user according to a periodical schedule or on an "as needed" basis.

Figure 7:
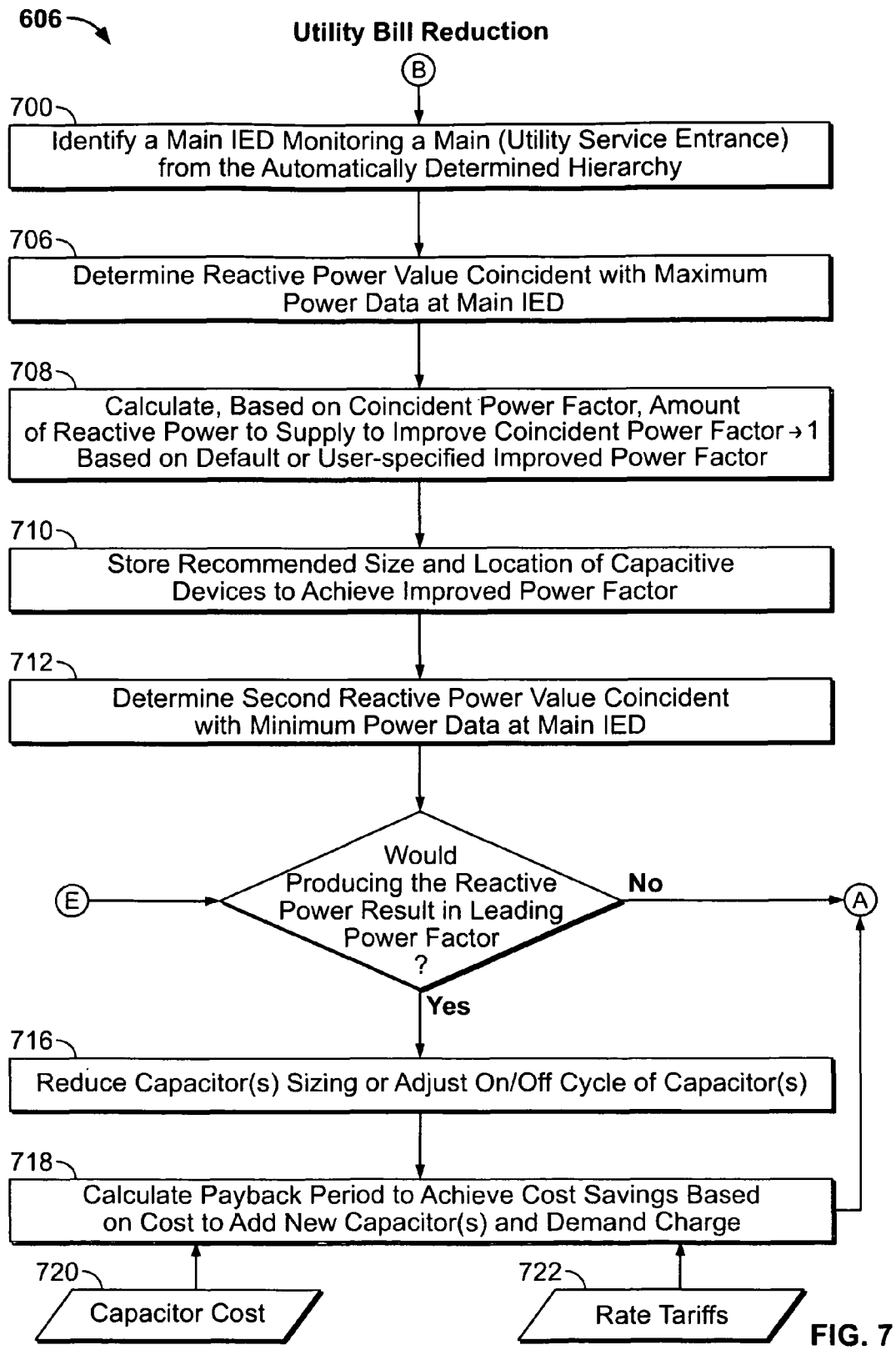
FIG. 7 is a flow chart of a utility bill reduction algorithm.

The aforementioned examples are carried out via a utility bill reduction algorithm 606. In a specific aspect, the utility bill reduction algorithm 606, illustrated as a flow diagram in FIG. 7, includes the following blocks. The algorithm 606 identifies a main IED that is monitoring a main (e.g., a utility service entrance) from the automatically determined hierarchy of the electrical system 102 (700). The algorithm 606 determines a reactive power value coincident with maximum power data by receiving the reactive power value from the main IED, or by deriving the reactive power value from (a) the maximum power data or from data representing the current and voltage signals and (b) the power factor coincident (i.e., measured or derived simultaneously with the measurement or derivation of the maximum power data) with the maximum power data (706). The algorithm 606 determines the amount of reactive power, based on the coincident power factor, to supply to improve the coincident power factor toward unity based on a default or a user-specified improved power factor (e.g., 95%) (708). The algorithm 606 stores the recommended size and location of one or more capacitor devices to achieve the improved power factor (710). The algorithm 606 determines a second reactive power value coincident with the minimum power data by receiving the second reactive power value from the main IED or by deriving the second reactive power value from the minimum power data or from data representing the current and voltage signals and the second power factor coincident with the minimum power data (712). The algorithm 606 determines whether producing the reactive power would result in an overcorrected (leading) power factor based on the second reactive power value (714). If so, the algorithm 606 reduces the capacitor sizing recommendation or recommends adjusting an on/off cycle of the at least one of the capacitors to reduce the overall reactive power produced by the capacitors (716). The algorithm 606 obtains the cost of the capacitors 720 from a lookup table or the end-user inputs the cost of the capacitors 720 and utility rate tariff information 722, and the algorithm 606 accesses these values to calculate a payback period to achieve cost savings based on the cost of the capacitors 720 and the utility rate tariff information 722 (718).

Released System Capacity

In order to release electrical system capacity for other uses, capacitors must be installed further down into the electrical system than the main service entrance. There are occasions when a transformer becomes overloaded or the end-user wishes to install additional loads onto a fully loaded circuit while minimizing additional capital expenditures. One option may be to install properly sized capacitors downstream from the electrical system components needing the increased capacity. The power factor evaluation system 105 allows the end-user to target any electrical system apparatus (e.g., transformers or conductors carrying load current) of the electrical system 102 to be analyzed for a potential increase in capacity (608).

For example, assume that an electrical system similar to that shown in FIG. 4 has been identified as having its transformer 412 operating at 106% of its rated capacity (Note: This identification can be determined from the rated capacity of the transformer 412 inputted by the end-user and from the power data received from the IED 422 indicating the overloading condition). Prolonged periods of overloading a transformer 412 will result in damaged winding insulation, ultimately shortening the transformer's life. The power factor evaluation system 105 evaluates the power data from the capable IED 422 just upstream from the transformer 412 to determine what, if any, benefits could be achieved by installing a capacitor bank 410 downstream from the transformer 412. In this example, assume that the upstream IED 422 measures 300 kW, 380 kVA, and 233 kVAR, with a coincident power factor of 79%. To release 6% of the system's capacity, the following equation can be used:

$$PF_{new} = \left(\frac{PF_{old}}{1 - kVA_{released}}\right) = \left(\frac{0.79}{1 - 0.06}\right) = 0.84$$

Using the same formulas from above, improving the power factor to 84% would require a capacitor bank 410 rated at approximately 40 kVAR. The resulting total apparent power flowing through the transformer 412 would be approximately 358 kVA. If the original load (380 kVA) was 106% above the transformer rating, the transformer rating is approximately 358 kVA (Note: this rating is not a practical transformer rating, but simply a value for purposes of illustrating this example). To release 6% capacity from the transformer, a capacitor bank 410 rated at approximately 40 kVAR should be installed downstream of the overloaded transformer 412. It should be noted that additional capacity is available to be released by further improving the power factor with additional capacitance per the formulas given above.

A "side effect" of releasing the capacity at the transformer 412 as shown in FIG. 4 is the released capacity of all circuits and equipment directly upstream from the capacitor bank 410. The auto-learned hierarchy algorithm not only provides a one-line diagram of the entire electrical system being monitored, but automatically provides locations of transformers within the hierarchy (based on voltage readings from each capable IED within the determined hierarchy). The power factor evaluation system 105 allows the end-user to select any capable IED within the hierarchy and determine not just the potential released capacity at that IED, but also how releasing capacity at a given IED will impact the load characteristics (e.g., reactive power) as measured by IEDs upstream from the selected IED. In this example, synchronous or pseudo-synchronous measurements are taken from the selected IED 422 and all upstream IEDs 420 that are either linked or indirectly linked to the selected IED 422. The amount of capacitance needed to meet the released capacity requirements would be determined for the selected IED 420. Finally, the reactive power associated with the capacitance determined in the previous step is used with the synchronously or pseudo-synchronously captured power measurements from upstream IEDs to ascertain the released capacity at those upstream measurement points Because none of this is straightforward without knowledge of the power monitoring system's hierarchy and at least pseudo-synchronous data captured from the appropriate IEDs, the majority of end-users simply do not try to resolve these inefficiencies and the result is that energy is uselessly wasted.

Figure 8:
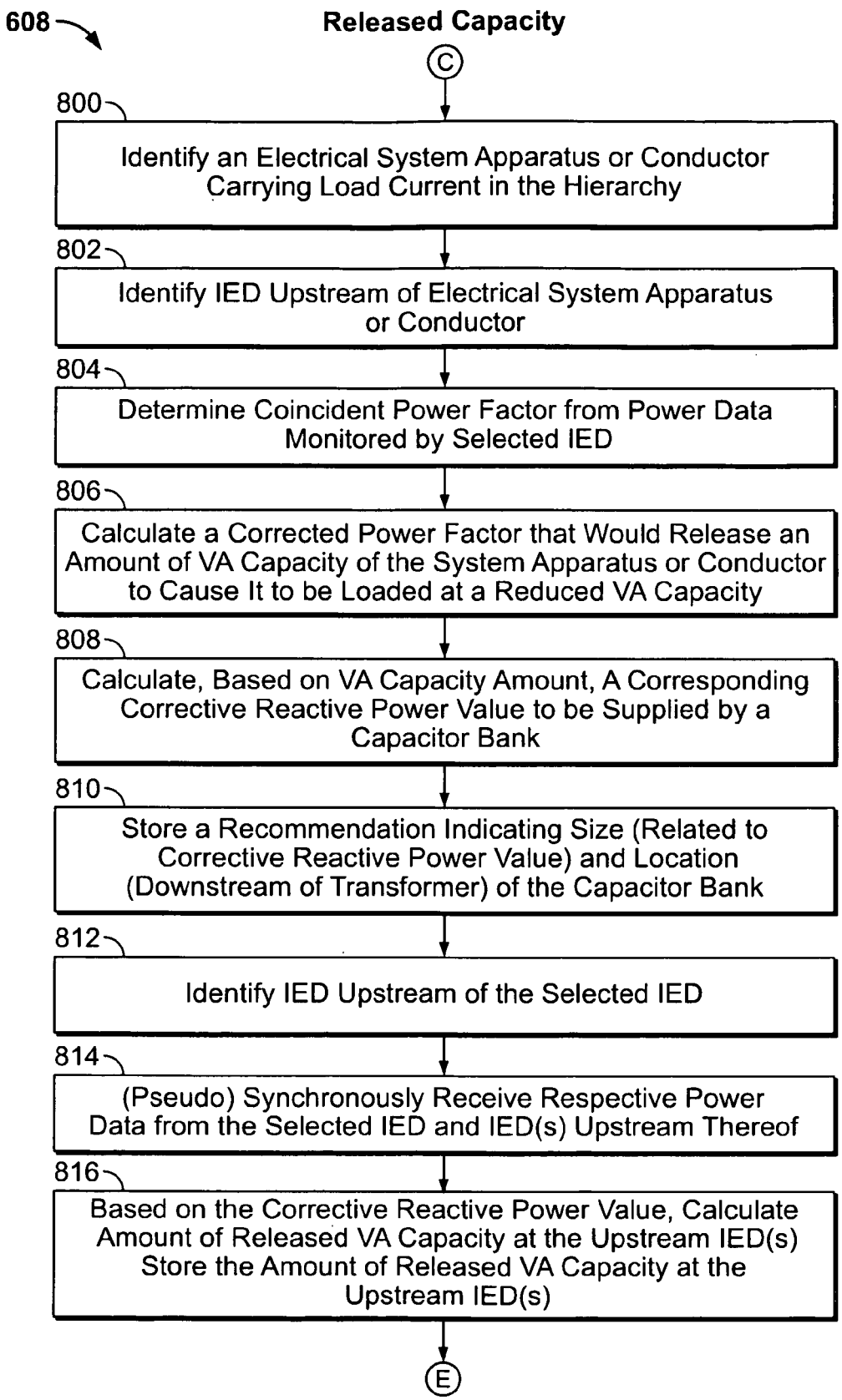
FIG. 8 is a flow chart of a released capacity algorithm.

The aforementioned examples are carried out via a released capacity algorithm 608. In a specific aspect, the released capacity algorithm 608, illustrated as a flow diagram in FIG. 8, includes the following blocks. The algorithm 608 identifies an electrical system apparatus, such as a transformer, or a conductor carrying load current in the automatically determined hierarchy (800). The algorithm 608 identifies an IED upstream of the electrical system apparatus or conductor (802). The algorithm 608 determines a coincident power factor from power data monitored by the selected IED (804). The algorithm 608 calculates a corrected power factor that would release an amount of apparent power (kVA) capacity of the electrical system apparatus or conductor to cause it to be loaded at a reduced apparent power capacity (806). The algorithm 608 calculates, based on the apparent power capacity amount, a corresponding corrective reactive power value to be supplied by a capacitor bank (808). The algorithm 608 stores a recommendation indicating a size (related to the corrective reactive power value) and a location (downstream of the transformer) of the capacitor bank to be installed (810). The algorithm 608 identifies an IED upstream of the selected IED by consulting the automatically determined hierarchy (812). The algorithm 608 synchronously (e.g., via the data alignment system 104) or pseudo-synchronously receives respective power data from the selected IED and the IED(s) upstream thereof (814). The algorithm 608 calculates, based on the corrective reactive power value, an amount of released apparent power capacity at the upstream IED(s) and stores the amount of potentially released apparent power capacity at the upstream IED(s) (816). The algorithm 608 optionally checks whether the corrective reactive power value would result in a leading power factor as described in blocks 714, 716, 718 in FIG. 7.

Loss Reduction

Another purpose for installing capacitor banks is to reduce losses (e.g., thermal losses due to $I^2R$) (610). As with the other purposes mentioned above, loss reduction basically relies on the reduction of current flow through conductors carrying load current, transformers and other equipment to improve the electrical system's efficiencies. Because losses are proportional to the square of the current ($I^2R$), the addition of a capacitor bank and subsequent reduction in current flow also decreases an electrical system's losses along the affected path. Ohm's law also proves that voltage drop is related to the current flow and if the current flow is reduced, so is the voltage drop. Accordingly, the installation of capacitors to an electrical system that consumes VARs will affect the capacity of the electrical system, the losses incurred within the electrical system, the voltage drop through the electrical system, and ultimately the energy supplied to the electrical system by the utility.

The end-user selects any capable IED within the hierarchy, and the algorithm 610 determines the reduction in losses due to improving the power factor. The equation for determining the loss reduction factor is given by:

$$\text{Loss reduction factor} = 1 - \left[\frac{PF_{old}}{PF_{new}}\right]^2$$

Most systems exhibit losses in the range of 2½-5% of the load kWh, depending on many factors including conductor sizes and lengths, the utilization of apparatuses such as transformers, and load parameters within the electrical system.

For example, assume that an electrical system operates at 2,500 kW for 80 hours per week at a power factor of 80%. It currently experiences 5% losses, which is typical. With energy costs at $0.07/kWh, the goal is to increase the electrical system's power factor up to 95% during its operational period. Using the loss reduction factor equation above, the loss reduction factor will be approximately 29%. The system loss reduction will be approximately 1.5% (given by 0.29× 0.05), resulting in an overall system loss of 3.5% instead of 5%. So, the energy savings per week is approximately equal to 2909 kWh per week (given by 0.015×2500 kW'80 hours/ week). This yields an annual savings of approximately $10, 180 (given by 2909 kWh/week×$0.07/kWh×52 weeks/yr). Using the formulas from other sections, the required capacitance to correct the power factor from 80% to 95% is 1053 kVAR. If the installed cost for capacitors is $25/kVAR, then the total installed cost is $26,332. The simple payback period would be approximately 31 months (given by [$26,332/$10, 180]×12 months/year).

Using a known hierarchy of power monitoring devices (IEDs), it is possible to determine the existing losses by using the voltage drop between related monitoring devices. Once these are known, the calculations in the above example are carried out. Again, a lookup table accessed by the power factor evaluation system 105 can determine the installed cost per kVAR, and the rate tariff information (cost per kWh) is entered by the end-user.

Voltage Improvement

Voltage drop through a circuit can be approximated by the following equation:

$$V_{drop} \approx I_{kW}R + X(I_x - I_c)$$

Thus if $I_c$ is made to equal $I_x$, the second term in the equation above equals zero. If $I_c$ becomes larger than $I_x$, then this represents overcorrection resulting in a leading power factor, and is undesirable.

Since capacitors reduce kVAR current in a lagging system, they also reduce the voltage drop commensurate to the product of the capacitive current and the reactance. An estimate of the voltage rise from the capacitor bank location through a transformer can be approximately stated as:

$$\Delta V = \frac{kVAR_{capacitor} \times (\% \text{ impedance of transformer})}{kVA \text{ of transformer}}$$

So using FIG. 4 as an example, installing 200 kVAR of capacitance downstream from a 10000 kVA transformer 414 with 5% impedance would result in a voltage increase of approximately 1%. Although the addition of capacitance does improve the voltage levels, there may be other more viable methods of increasing voltage in an electrical system than by using capacitors (e.g., adjusting transformer taps, moving loads, etc.). Although estimates can be made, greater accuracy is obtained by the end-use's inputting the transformer's % impedance.

Figure 9:
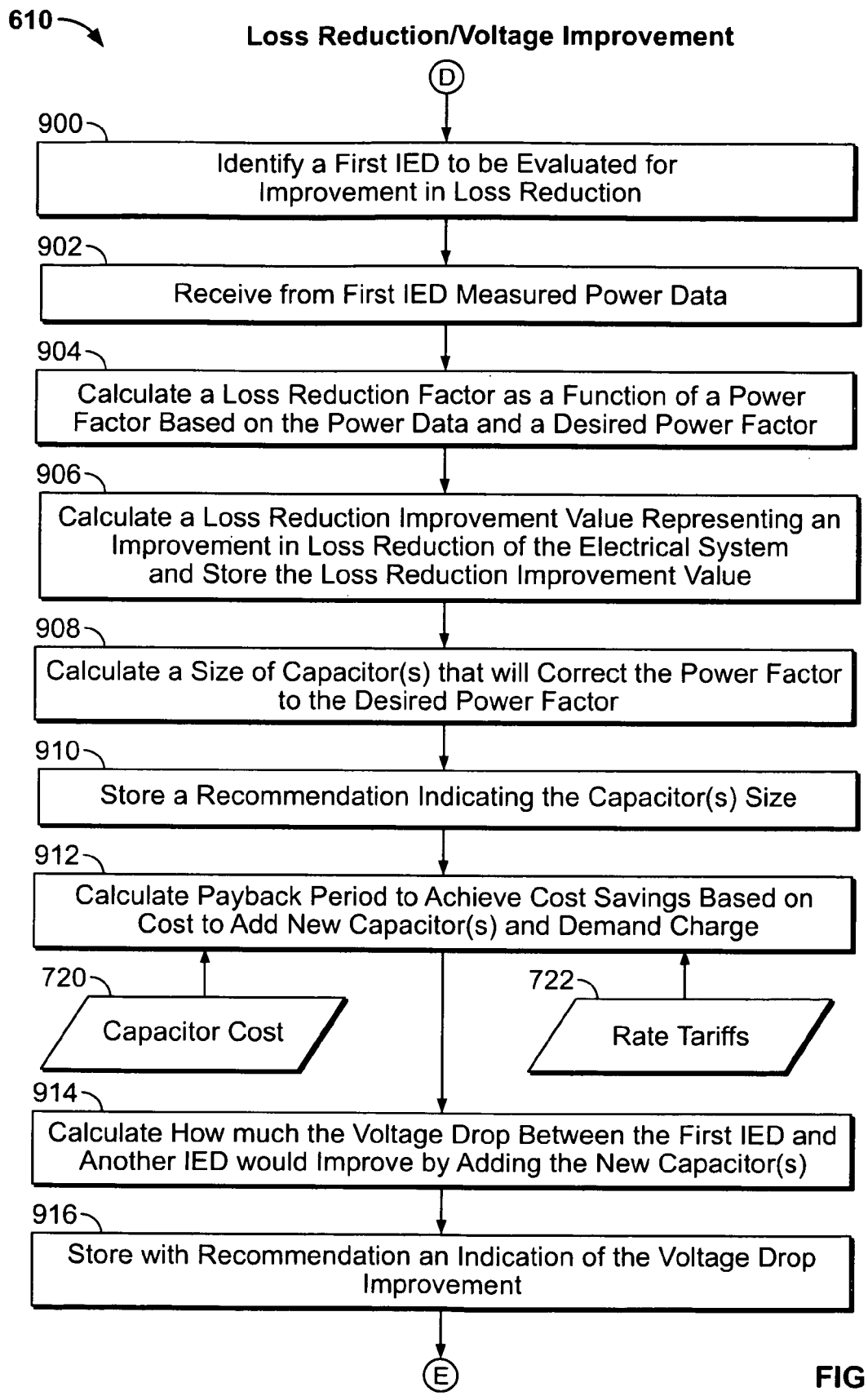
FIG. 9 is a flow chart of a loss reduction/voltage improvement algorithm.

The aforementioned loss-reduction and voltage-improvement examples are carried out via a loss reduction/voltage improvement algorithm 610. In a specific aspect, the algorithm 610, illustrated as a flow diagram in FIG. 9, includes the following blocks. A first IED is identified to be evaluated for improvement in loss reduction (900). The first IED can be identified by receiving a selection from the end-user of the first IED, or, alternatively, the algorithm 610 analyzes the electrical system to identify the first IED as a candidate that presents the best opportunities for power factor correction without user intervention. The algorithm 610 receives from the first IED power data measured by the first IED (902). The algorithm 610 calculates a loss reduction factor as a function of a power factor based on the power data and a desired power factor (904). The algorithm 610 calculates a loss reduction improvement value representing an improvement in loss reduction of the electrical system and stores the loss reduction improvement value (906). The algorithm 610 calculates the size of one or more capacitors that will correct the power factor to the desired power factor (908). The algorithm 610 stores a recommendation indicating the size of the capacitor(s) (910). The algorithm 610 calculates a payback period to achieve cost savings based on the capacitor cost (which may be retrieved from a lookup table or entered by the end-user) 720 and the rate tariffs (which may be entered by the end-user) 722 (912). The algorithm 610 calculates how much the voltage drop between the first IED and another IED would improve by adding the new capacitor(s) (914). The algorithm 610 stores with the recommendation an indication of the voltage improvement (e.g., 1%) (916). The algorithm 610 optionally checks whether the corrective reactive power value would result in a leading power factor as described in blocks 714, 716, 718 in FIG. 7.

Any of the algorithms disclosed herein, including the auto-learned algorithm, and the algorithms 600, 606, 608, 610 include machine readable instructions for execution by: (a) a processor, (b) a controller, and/or (c) any other suitable processing device. It will be readily understood that the computer 132 includes such a suitable processing device. Any algorithm disclosed herein may be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a controller and/or embodied in firmware or dedicated hardware in a well known manner (e.g., it may be implemented by an application specific integrated circuit (ASIC), a programmable logic device (PLD), a field programmable logic device (FPLD), discrete logic, etc.). Also, some or all of the machine readable instructions represented in any flowchart depicted herein may be implemented manually. Further, although specific algorithms are described with reference to flowcharts depicted herein, persons of ordinary skill in the art will readily appreciate that many other methods of implementing the example machine readable instructions may alternatively be used. For example, the order of execution of the blocks may be changed, and/or some of the blocks described may be changed, eliminated, or combined.

The terms "first," "second," and so forth as used herein are not intended to convey any temporal or spatial ordering but rather are simply intended to distinguish a device, block, or process from another device, block, or process. The function of displaying can be carried out via a conventional video display, such as an LCD monitor.

The need for expert-based monitoring systems has never been greater with the rising cost of energy and the impact of reliability on the bottom line. The new and innovative features outlined herein provide much easier methods for improving energy efficiency without incorporating experts, special software, and detailed data collection and analysis.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. An automatic power factor correction analysis method, comprising:
   automatically determining a hierarchy of an electrical system, the hierarchy indicating how a number of intelligent electronic devices (IEDs) are linked to one another in the electrical system, each of the IEDs monitoring electrical characteristics;
   automatically storing a data representation of the hierarchy;
   automatically identifying from the automatically determined hierarchy a main IED that is monitoring a main power supply in the hierarchy;
   receiving maximum power data from corresponding current and voltage signals monitored by the main IED and an associated power factor that is coincident with the maximum power data;

determining a reactive power value coincident with the maximum power data by receiving the reactive power value from the main IED or by deriving the reactive power value from the maximum power data or from data representing the current and voltage signals and the power factor coincident with the maximum power data; and calculating, based on the coincident power factor, an amount of positive or negative reactive power to supply to improve the coincident power factor toward a unity value, and, responsive thereto, storing a recommendation indicating at least a location and a size of one or more capacitors to be added in the automatically determined hierarchy for producing at least the amount of the reactive power such that the reactive power value is offset by the amount of the reactive power.

2. The method of claim 1, further comprising:
receiving minimum power data from the corresponding current and voltage signals monitored by the main IED and an associated second power factor;
determining a second reactive power value coincident with the minimum power data by receiving the second reactive power value from the main IED or by deriving the second reactive power value from the minimum power data or from data representing the current and voltage signals and the second power factor coincident with the minimum power data; and
verifying whether producing the amount of the reactive power automatically determined based on the coincident power factor would result in a leading power factor based on the second reactive power value.

3. The method of claim 2, further comprising, if the verifying would result in the leading power factor, reducing the size of the one or more capacitors such that the amount of reactive power produced by the one or more capacitors is reduced so as to cause a corresponding power factor to not be leading.

4. The method of claim 2, further comprising, if the verifying would result in the leading power factor, determining a periodicity to cycle at least one of the one or more capacitors on and off so as to cause a corresponding power factor to not be leading.

5. The method of claim 1, further comprising calculating a cost savings realized by the addition of the one or more capacitors.

6. The method of claim 5, further comprising calculating a payback period indicating how long it would take for a cost of adding the one or more capacitors to be offset by the cost savings realized by adding the one or more capacitors.

7. The method of claim 1, further comprising receiving an indication of a desired power factor between the coincident power factor and the unity value, wherein the calculating the amount of reactive power is based on the desired power factor.

8. The method of claim 1, further comprising, prior to the storing the recommendation:
automatically determining whether an elevated level of harmonic frequencies exist in current or voltage signals being monitored by the main IED in the hierarchy; and
if the level of the harmonic frequencies exceeds a threshold, storing with the recommendation an indication that the harmonic frequencies are present.

9. The method of claim 8, wherein the automatically determining whether the elevated level of harmonic frequencies exist is carried out by comparing a true power factor with a displacement power factor.

10. The method of claim 8, wherein the automatically determining whether the elevated level of harmonic frequencies exist is carried out by measuring, at the main IED, reactive currents at non-fundamental frequencies, and determining whether the reactive currents exceed at least one criterion.

11. The method of claim 1, further comprising:
identifying a transformer in the hierarchy;
identifying from the automatically determined hierarchy a first IED that is upstream of the transformer;
determining a first power factor from power data monitored by the first IED;
calculating, based on the first power factor, a corrected power factor that would release an amount of volt-amps capacity of the transformer to cause the transformer to be loaded at a reduced volt-amps capacity; and
calculating, based on the amount of volt-amps capacity, a corresponding corrective reactive power value to be supplied by a capacitor bank, wherein the recommendation includes an indication of a size and a location of the capacitor bank, wherein the size is related to the corrective reactive power value and the location is downstream of the transformer in the automatically determined hierarchy.

12. The method of claim 1, further comprising:
receiving a selection of a first of the IEDs;
receiving from the first IED power data measured by the first IED;
calculating a loss reduction factor as a function of a power factor based on the power data and a desired power factor;
calculating a loss reduction improvement value representing an improvement in loss reduction of the electrical system and storing the loss reduction improvement value; and
calculating a size of a second set of one or more capacitors that will correct the power factor to the desired power factor, wherein the recommendation includes an indication of the size of the second set of the one or more capacitors.

13. An automatic power factor correction analysis method, comprising:
automatically determining a hierarchy of an electrical system, the hierarchy indicating how a number of intelligent electronic devices (IEDs) are linked to one another in the electrical system, each of the IEDs monitoring electrical characteristics;
automatically storing a data representation of the hierarchy;
identifying a transformer in the hierarchy;
identifying from the automatically determined hierarchy a first IED that is upstream of the transformer;
determining a coincident power factor from power data monitored by the first IED;
calculating, based on the coincident power factor, a corrected power factor that would release an amount of volt-amps capacity of the transformer to cause the transformer to be loaded at a reduced volt-amps capacity;
calculating, based on the amount of volt-amps capacity, a corresponding corrective reactive power value to be supplied by a capacitor bank; and
storing a recommendation indicating a size and a location of the capacitor bank, wherein the size is related to the corrective reactive power value and the location is downstream of the transformer in the automatically determined hierarchy.

14. The method of claim 13, further comprising:
automatically identifying at least one IED in the automatically determined hierarchy that is upstream of the first IED;

receiving respective power data from the first IED and the at least one IED pseudo-synchronously;

based on the corrective reactive power value, calculating an amount of released volt-amps capacity at the at least one IED; and storing the amount of released volt-amps capacity at the at least one IED.

15. An automatic power factor correction analysis method, comprising:

automatically determining a hierarchy of an electrical system, the hierarchy indicating how a number of intelligent electronic devices (IEDs) are linked to one another in the electrical system, each of the IEDs monitoring electrical characteristics;

automatically storing a data representation of the hierarchy;

receiving a selection of a first of the IEDs;

receiving from the first IED power data measured by the first IED;

calculating a loss reduction factor as a function of a power factor based on the power data and a desired power factor;

calculating a loss reduction improvement value representing an improvement in loss reduction of the electrical system and storing the loss reduction improvement value;

calculating a size of one or more capacitors that will correct the power factor to the desired power factor; and storing a recommendation indicating the size of the one or more capacitors.

16. The method of claim 15, further comprising calculating a cost savings realized by the addition of the one or more capacitors.

17. The method of claim 15, further comprising calculating a payback period indicating how long it would take for a cost of adding the one or more capacitors to be offset by the cost savings realized by adding the one or more capacitors.

18. The method of claim 15, further comprising calculating how much the voltage drop between the first IED and another of the IEDs would improve by the addition of the one or more capacitors, wherein the recommendation includes an indication of the voltage drop improvement.

* * * * *